US007013452B2

(12) United States Patent
Baras et al.

(10) Patent No.: US 7,013,452 B2
(45) Date of Patent: *Mar. 14, 2006

(54) METHOD AND APPARATUS FOR INTRA-LAYER TRANSITIONS AND CONNECTOR LAUNCH IN MULTILAYER CIRCUIT BOARDS

(75) Inventors: Torben Baras, New Providence, NJ (US); Alan Michael Lyons, New Providence, NJ (US); Carsten Metz, Chatham Township, Morris County, NJ (US)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 10/395,956

(22) Filed: Mar. 24, 2003

(65) Prior Publication Data
US 2004/0188138 A1  Sep. 30, 2004

(51) Int. Cl.
*G06F 17/50* (2006.01)
(52) U.S. Cl. .................................................. 716/15
(58) Field of Classification Search ............ 716/12–15; 174/255, 266; 333/128; 29/600
See application file for complete search history.

(56) References Cited

U.S. PATENT DOCUMENTS 5,438,297 A  8/1995  Rahal-Arabi et al. ....... 327/565
5,646,368 A  7/1997  Muyshondt et al. .......... 174/33
6,388,208 B1 *  5/2002  Kiani et al. .................. 174/266
6,528,733 B1 *  3/2003  Takenaka et al. ........... 174/255
6,608,535 B1 *  8/2003  Sherman et al. ............ 333/128
6,622,370 B1 *  9/2003  Sherman et al. ............. 29/600
6,640,332 B1 * 10/2003  Mitome et al. ............... 716/15

OTHER PUBLICATIONS

Maeda, S., et al, "A Study on Measurement and Simulation for the Propagation Characteristics of Through-Hole", *Electronics & Communications in Japan, Part II—Electronics, Scripta Technica, Inc., New York*, vol. 74, No. 7, (Jul. 1, 1991), pp. 61-72.
Kazuhiro, N., "Microstrip Line Resonance Element", *Patent Abstracts of Japan*, vol. 1997, No. 9, (Sep. 30, 1997), 1 pages & JP 9 139611 A (Alps Electric Co Ltd), (May 27, 1997), 1 page.
European Search Report for Application No. 04250909.1 (Jun. 1, 2004), 4 pages,.

* cited by examiner

*Primary Examiner*—Vuthe Siek
(74) *Attorney, Agent, or Firm*—David W. Herring; Donald P. Dinella

(57) ABSTRACT

An apparatus is disclosed that substantially reduces or eliminates the resonance that occurs in vias that connect the layers of a printed circuit board by electrically coupling a first transmission line in a circuit board to a second transmission line in a circuit board by two electrical paths having substantially the same electrical length. The two electrical paths are created by connecting the first transmission line to a first via which is in turn connected to a second via having a second transmission line with a plurality of connecting electrical paths between the two vias. In one illustrative embodiment, electrical traces are used to connect the top of the first via to the top of the second via and the bottom of the first via to the bottom of the second via.

9 Claims, 9 Drawing Sheets

METHOD AND APPARATUS FOR INTRA-LAYER TRANSITIONS AND CONNECTOR LAUNCH IN MULTILAYER CIRCUIT BOARDS

FIELD OF THE INVENTION

The present invention relates generally to circuit board design and, more particularly, to the design of circuit boards capable of high-speed data throughput.

BACKGROUND OF THE INVENTION

Efficient transmission of highspeed electrical signals is essential to meet the demanding requirements of telecommunications network systems operating at or above 10 Gigabits-per-second (Gbps). Printed circuit boards and individual circuit elements on those boards, such as transmission lines and connectors, must be carefully designed to minimize signal loss. The importance of the transitions between these transmission lines and connectors is increasing as telecommunications systems operate at higher speeds. As frequencies rise to 10 GHz and higher these transitions become critical to RF performance.

Most circuit boards used in high-speed telecommunications applications (as well as many other applications) are multi-layered printed circuit boards. A portion of one such board is shown in FIG. 1. In the board of FIG. 1, as is typical with such circuit boards, circuit paths 101 and 111 (also referred to as traces) carry electrical signals across the circuit board. The illustrative circuit board has layers 102, 105, 106 and 107 which are fabricated using well-known fabrication techniques so that at least some of the aforementioned layers can carry data between two or more different components connected to the board. Dielectric layers are placed between the layers 102, 105, 106 and 107 to electrically isolate the traces on those individual layers and, for example, to define the transmission line impedance. Typically, once the board layers are assembled into a multi-layered circuit board, vias such as via 103 having connection pads 104, 108, 109 and 110 are drilled into the multi-layer circuit board and coated with a conducting material, such as copper, in order to provide a way to connect a trace on one layer of the circuit board to a trace on another layer of the circuit board. Additionally, after assembly of the board, chips and sockets and other components are soldered onto the board. In operations, for example, a signal travels along entering trace 101 in direction 112 until it reaches via 103. The aforementioned conducting material of via 103 conducts the signal down the length of the via 103 to exit trace 111. Exit trace 111 then conducts the signal in direction 113 to a desired destination, such as a circuit board component connected trace 111.

FIG. 2 shows how, instead of using vias to connect two traces at different layers of a circuit board, vias can be used to connect external packages to a trace at a particular layer of the circuit board. In particular, external electronics packages typically have one or more connectors, such as press-fit connector 201, that are sized to fit within via 103. In operations, for example, a signal is transmitted by the electronics package connector through the via at which point it is routed via exit trace 111 to its destination. In such implementations, via 101 of FIG. 1 would not be used.

The illustrative vias shown in FIGS. 1 and 2 are widely used in circuit board design and are effective for connecting internal or external signal, ground and voltage lines to different layers of the board, especially at lower transmission frequencies. However, as the signal transmission speeds (e.g., above 5 Gbps) and frequencies increase, the vias described above become less effective. Specifically, as is well-known in the art, as the frequency increases the use of vias causes resonance. Thus, the amplitude of the signal exiting the via is greatly reduced as the frequency increases.

FIG. 3 shows how resonance is created due to the use of vias in circuit boards. Once again, as described above, a data-carrying signal travels in direction 312 along trace 301 in circuit board layer 302. When the signal reaches via 303, it is transmitted in direction 305 to trace 306 in layer 304. The signal is then routed along trace 306 to a desired destination. However, resonance is created by via 303 because, in addition to traveling in path 305 to trace 306, the signal partially also travels along paths 309, 310, 311 and 312 along the conductive coating of via 303. Depending upon the frequency and wavelength of the signal and the electrical length of paths 309, 310, 311 and 312, the via will resonate and cause destructive interference with signal 305.

FIG. 4A shows a graph 401 of a typical signal loss experienced by vias, such as that illustrated in FIG. 3, to connect transmission lines on a circuit board. Specifically, graph 401 shows line 402, which represents the signal strength of a given trace (such as that illustrated in FIG. 4B), and line 403, which shows the results of the use of vias connected to the trace (such as is illustrated in FIG. 4C).

FIG. 4B shows a transmission line that consists of trace 416 on circuit board 415. Plot 402 represents a simulation of the signal output at point B for an input at point A of a signal of a given frequency. Referring once again to plot 402 in FIG. 4A, signal loss occurs as a signal is transmitted along the trace mostly because of well-known conductor loss and material loss in the transmission line and the surrounding dielectric layers. Line 402 on graph 401 shows that, at very low frequencies, there is virtually no signal loss. This line also shows that the signal amplitude drops as the frequency rises until, at 10 GHz, the signal loss equals approximately 3.5 dB.

Plot 403 in FIG. 4A shows the results of using vias together with a transmission line carrying the same original signal as that used as an input to create plot 402. More particularly, plot 403 represents the loss experienced over a trace connected to two vias, such as illustrated in FIG. 4C. In the configuration of FIG. 4C, a signal enters the circuit board at point A' and is conducted within circuit board 404 along trace 405 in direction 406. Via 407 conducts the signal in direction 408 to trace 410 that is, for example, 200 mm in length and is at a different layer of circuit board 404 than trace 405. The signal travels in direction 409 along trace 410. Via 411 conducts the signal in direction 412 to trace 414, which conducts the signal in direction 413 to point B'. Plot 403 in FIG. 4A is a representation of simulated measurements taken at point B' in FIG. 4B.

For this configuration, plot 403 shows that, beginning below a frequency of 1 GHz, resonance causes the transmitted signal to degrade in a nonlinear fashion. At 3 GHz, the resonance causes a modest signal loss of approximately 3 dB. However, the resonance increases nonlinearly as a function of frequency until, at approximately 8 GHz, the resulting signal loss is in excess of 16 dB. Thus, especially when connected with other circuit design elements, typical prior art vias are unsuitable for high-frequency applications.

FIGS. 5 and 6 show prior attempts to reduce the effects of resonance shown in FIG. 3. FIG. 5 shows a method, known as blind-via, which is useful for at least partially reducing the resonance described above. In FIG. 5, trace 502 is, illustratively, a data-carrying trace on which a data signal is carried in direction 508 to via 503. Alternatively, as discussed previously, connector 506 may be inserted into via 503 in direction 507 to introduce a signal from an external electronics package into via 503. If via 503 is used to connect to such an external package, trace 502 typically would not be present. Trace 505 then routes the inserted signal to an intended destination in direction 509. Comparing FIG. 5 to FIG. 3, however, it can be seen that, unlike via 303, via 503 does not extend the entire depth of the circuit board 501. This is because, using a blind-via technique allows drilling of vias of only a specified depth. Thus, a path similar to path 309 in FIG. 3 does not exist in FIG. 5 and, accordingly, the resonance is greatly reduced. However, resonance is not eliminated because, while a large portion of the via 503 is eliminated compared to via 303 in FIG. 3, a small portion remains, such as portion 511. Additionally, a blind via does not eliminate portion 510 of via 503 above trace 502. Thus, portions 510 and 511 of via 503 lead to some level of signal-interfering resonance, albeit greatly reduced compared to the resonance experienced within via 303 of FIG. 3. The most significant disadvantage to drilling blind vias is cost. Replacing the vias on a circuit board with blind vias at least doubles the cost of manufacturing such a board compared to a board using the traditional vias of FIG. 3.

FIG. 6 shows another prior attempt to eliminate the resonance of FIG. 3. Specifically, FIG. 6 shows a technique of removing an unnecessary, resonance-inducing portion of a via by counterboring the via. Compared to the blind-via embodiment of FIG. 5, via 601 in FIG. 6 is drilled entirely through the circuit board 501 and conducting material 504 is disposed on the inner surface of the via 601. Area 608 is removed by counterboring in a way such that the conducting material 504 is removed, thus removing a signal path that causes resonance, such as signal path 309 in FIG. 3. However in the embodiment in FIG. 6, as with the embodiment of FIG. 5, small portions of the via such as portions 609 and 610, typically remain and, as a result, the quality of the signal path is deteriorated. Additionally, the circuit boards using counterboring are at least 25%–30% more expensive to manufacture.

SUMMARY OF THE INVENTION

We have discovered that the resonance that occurs in vias that connect the layers of a printed circuit board may be substantially eliminated by electrically coupling a first transmission line in a circuit board to a second transmission line in a circuit board by two electrical paths having substantially the same electrical length. Electrical length is discussed herein below. The two electrical paths are created by connecting the first transmission line to a first via, which is in turn connected to a second via having a second transmission line, with a plurality of connecting electrical paths of equal electrical length. The first transmission line may be an electrical trace disposed on a layer of a circuit board and connected to the first via. Alternatively the first transmission line may be a connector to an external electrical circuit that is plugged into or soldered onto the first via.

In one illustrative embodiment of the invention, a signal introduced into the first via by the first transmission line is conducted along two electrical paths to the second via which is, in turn, electrically connected to the second transmission line. The first electrical path is created by electrically connecting the top of the first via to the top of the second via. The second electrical path is created by electrically connecting the bottom of the first via to the bottom of the second via.

These two electrical connections are created, for example, by well-known electrical traces. The lengths of the electrical traces are chosen such that the first electrical path is equal in electrical length to said second electrical path. Therefore, the time for an electromagnetic pulse, such as that carrying a data signal, to travel over the first electrical path will equal the time necessary for that signal to travel over the second electrical path.

DETAILED DESCRIPTION

Figure 7:
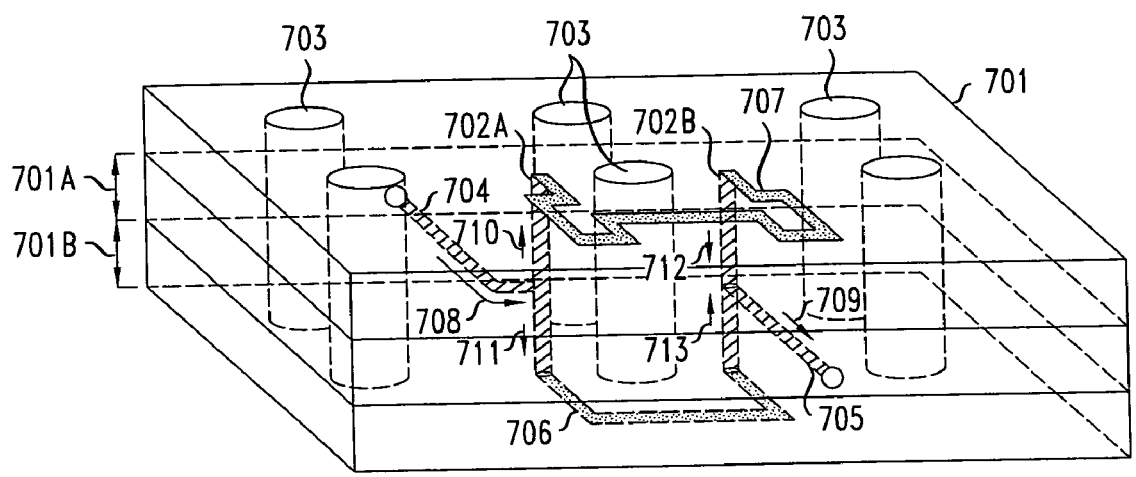
FIG. 7 shows an illustrative embodiment in accordance with the principles of the present invention whereby two delay lines are used to connect two vias in separate channels in a manner such that the resonance shown in FIG. 4A is substantially eliminated.

FIG. 7 shows a portion of a circuit board in accordance with the principles of the present invention whereby the aforementioned resonance of prior attempts is essentially eliminated through the use of two vias electrically coupled by two discrete delay paths. In FIG. 7, circuit board 701 has signal vias 702A and 702B separated by one of the ground vias 703. Vias 702A and 702B each are drilled completely through circuit board 701. Separating the vias with a ground via places each via into a different channel and ensures electrical isolation of the two vias 702A and 702B. This prevents interaction between the signals conducting within vias 702A and 702B.

Figure 1:
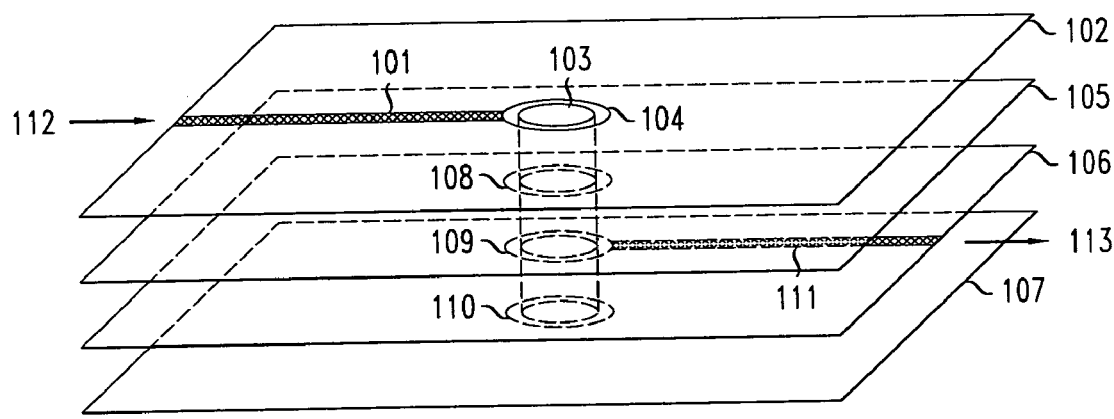
FIG. 1 shows a portion of a prior art circuit board that uses a via to route a signal to a different layer of a circuit board.
Figure 2:
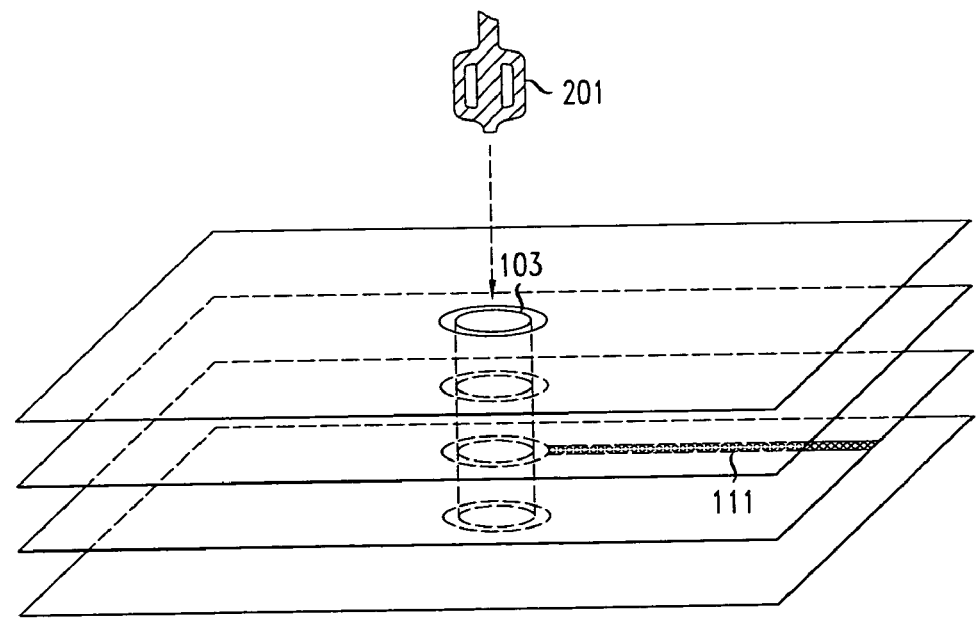
FIG. 2 shows a typical prior art press fit connector used with the via of FIG. 1.
Figure 3:
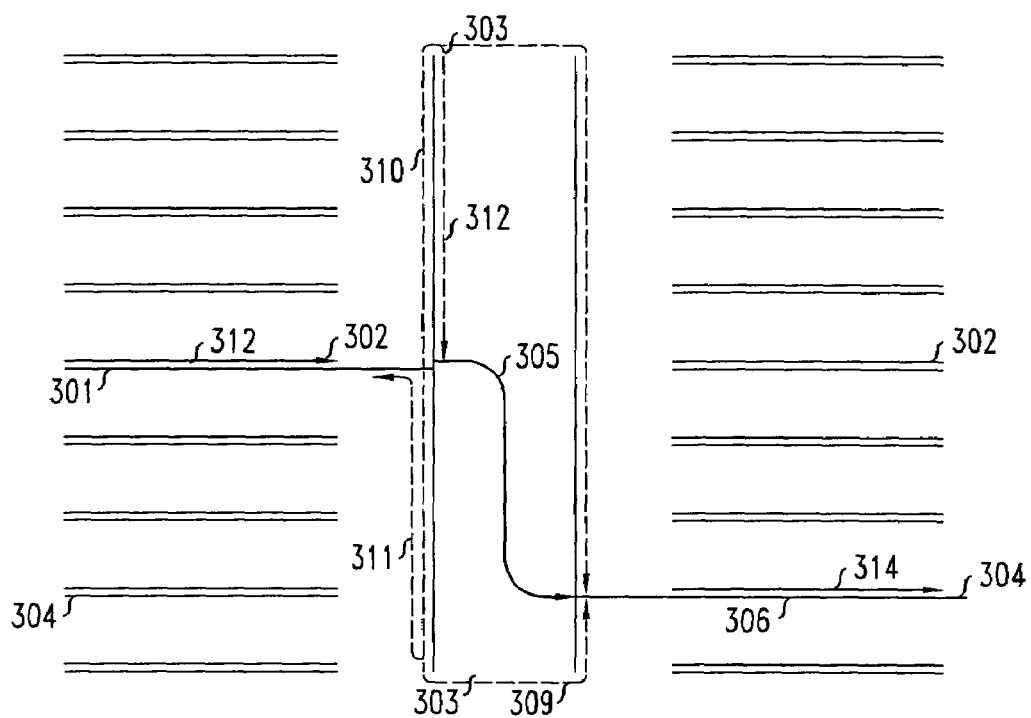
FIG. 3 shows the different signal paths upon which a signal travels in the via of FIG. 1, thus causing destructive resonance.
Figure 4A:
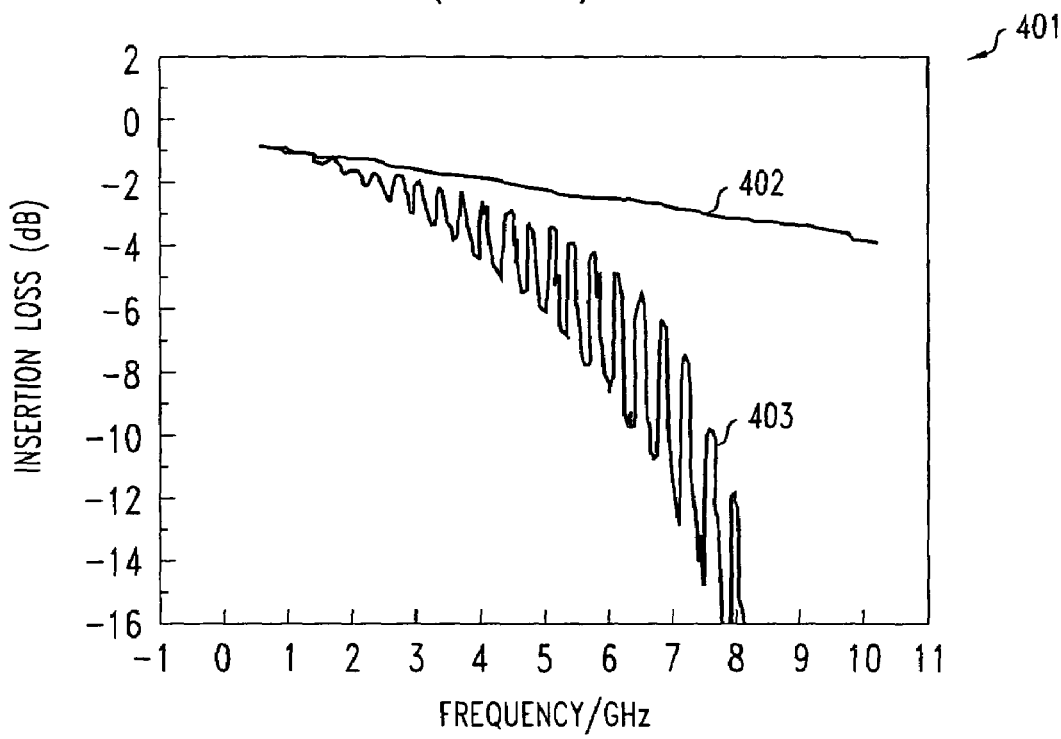
FIG. 4A shows a graph of the signal loss caused by the resonance of FIG. 3 compared to the signal loss across a prior art uninterrupted signal trace.
Figure 4B:
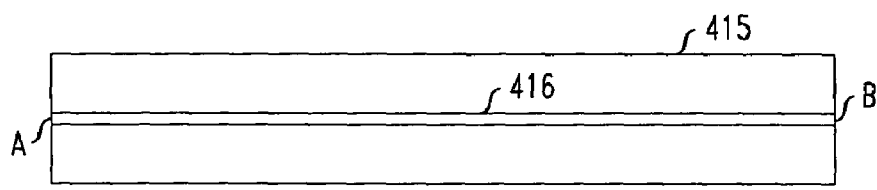
FIG. 4B shows the first model used to simulate the measurement of the signal loss plotted in FIG. 4A.
Figure 4C:
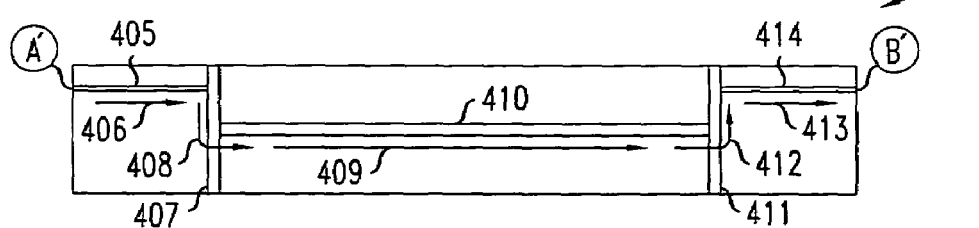
FIG. 4C shows the second model used to simulate the measurement of the signal loss plotted in FIG. 4A.
Figure 5:
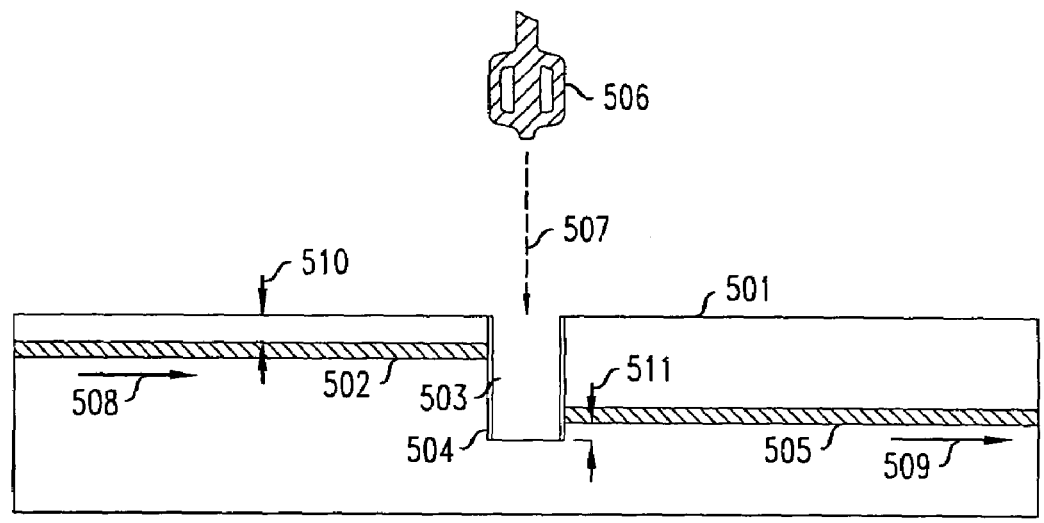
FIG. 5 shows a prior art blind-via method of reducing the resonance-induced signal loss shown in FIG. 4A.
Figure 6:
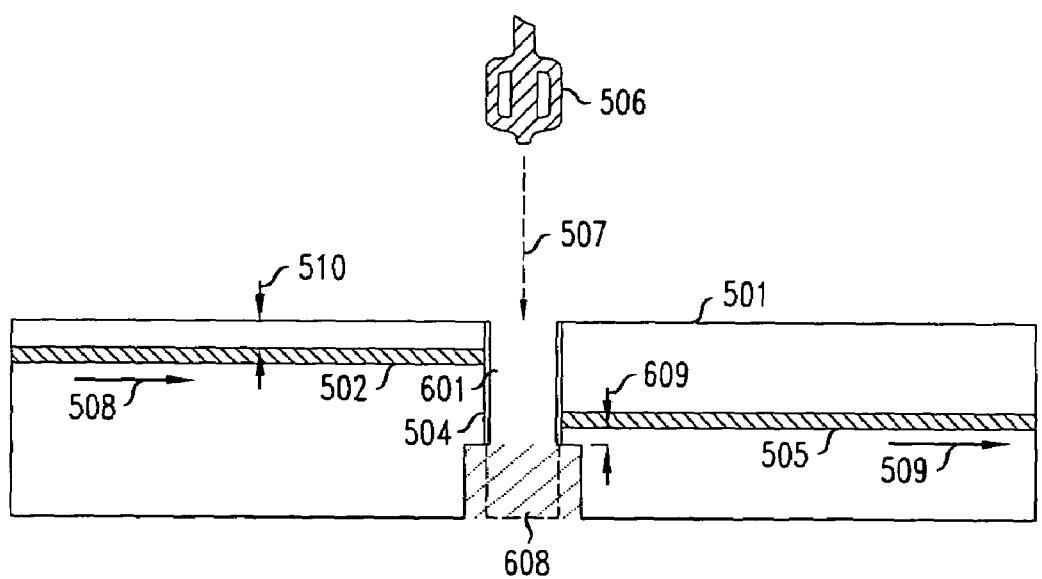
FIG. 6 shows a prior art counterboring method of reducing the resonance-induced signal loss shown in FIG. 4A.

A signal enters circuit board 701 along trace 704 in circuit board layer 701A. The signal is conducted along signal trace 704 in direction 708 to a signal input location on via 702A where trace 704 electrically contacts via 702A. As used herein, signal input location is that location on a via where an electrical signal is input to the via. This location could be either the location where a trace contacts the via or, alternatively, where a connector is inserted into a via. Via 702A does not have a single exit trace to conduct signals to a desired destination, such as that used in prior attempts. Instead, via 702A is electrically connected to via 702B by delay traces 706 and 707. Traces 706 and 707 are termed "delay traces" to differentiate those traces from traces 704 and 705. Traces 706 and 707 connect the bottom end and top end of via 702A with the bottom end and top end of via 702B, respectively. When the signal traveling in direction 708 reaches via 702A, it travels in both directions 710 and 711. However, instead of being reflected upon reaching either end of via 702A, each of the resulting signals traveling in directions 710 and 711 is conducted along delay traces 707 and 706, respectively, to via 702B. Thus, connecting the ends of the vias as shown in FIG. 7 effectively eliminates the resonance illustrated by trace 403 in FIG. 4 which was caused by the reflected signals and resulting resonance in the via of FIG. 3.

The signals from either end of via 702A are conducted along traces 706 and 707 to the corresponding end of via 702B. Once reaching via 702B, the signals travel in direction 712 and 713 toward trace 705 which is, for example, in layer 701B of circuit board 701. Upon reaching trace 705, which is located at a signal output location of via 702B, the signals traveling in direction 712 and 713 combine and are conducted along trace 705 in direction 709 to a desired destination. Signal output location, as used herein, is that location on a via where a signal is output from the via. Such location is, for example, the location where a trace is electrically connected to the via.

At first glance, it would appear that the aforementioned resonance problem of prior attempts would simply be transferred from via 702A to via 702B. To prevent any resonance or interference within via 702B, the design of delay traces 707 and 706 are critical. Specifically, these traces must be designed such that the electrical length of the path traveled by the signal traveling in directions 710 and 712 is exactly the same as the electrical length of the path of the signal traveling in directions 711 and 713. Electrical length, as used herein, is defined as the length of an electrical path over which an electromagnetic wave will travel a known distance in a known period of time. Electrical length depends, for example, upon the material used to create the path, as well as the electrical field properties surrounding the path. Such a design ensures that each of the signals initially traveling in directions 710 and 711 will arrive simultaneously at trace 705 and will not destructively interfere with one another. Methods for designing traces to a particular electrical length are very well known and it will be obvious to one skilled in the art how to design such traces to conduct signals from the top and the bottom of vias 702A and 702B in light of the disclosure herein.

Figure 8:
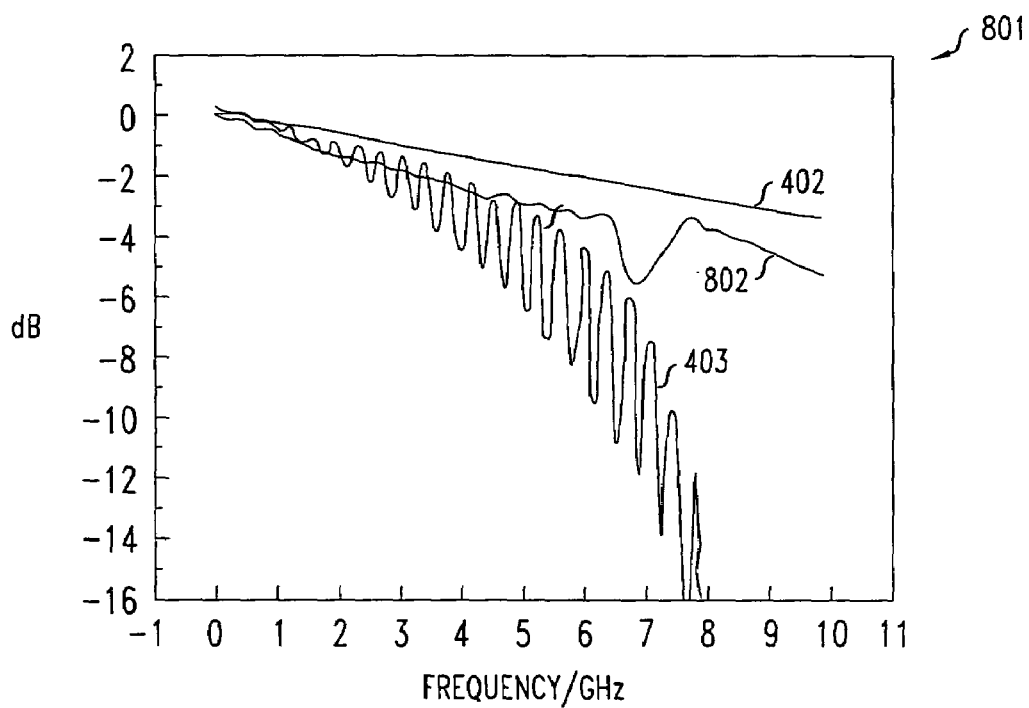
FIG. 8 shows a plot of the signal loss for the illustrative embodiment of FIG. 7.

FIG. 8 shows a graph of the signal amplitude as a function of frequency that results when the dual via configuration of FIG. 7 is used. The model used to obtain plot 802 in that figure is identical to that used to obtain plot FIG. 4B with the exception that each of vias 407 and 411 in FIG. 4B have been replaced with a dual via configuration similar to that shown in FIG. 7. Referring to FIG. 8 it is evident that the signal loss represented by plot 802, using a model with the dual vias of FIG. 7, is greatly reduced relative to the single via approach, represented by plot 403.

While the embodiment of FIG. 7 greatly reduces the negative effects of using a single via for high-frequency applications, and is quite satisfactory for such applications, it tends to require a large footprint on a circuit board. This is because, as discussed above, the signal vias 702A and 702B are separated into different channels by placing a ground via 703 between the two signal vias 702A and 702B. While this electrically isolates the vias from each other, the delay traces 706 and 707 that connect the signal vias must be routed around the ground via at an appropriate distance and, thus, the area of the circuit board required to implement the dual via approach of FIG. 7 is relatively large.

Figure 9:
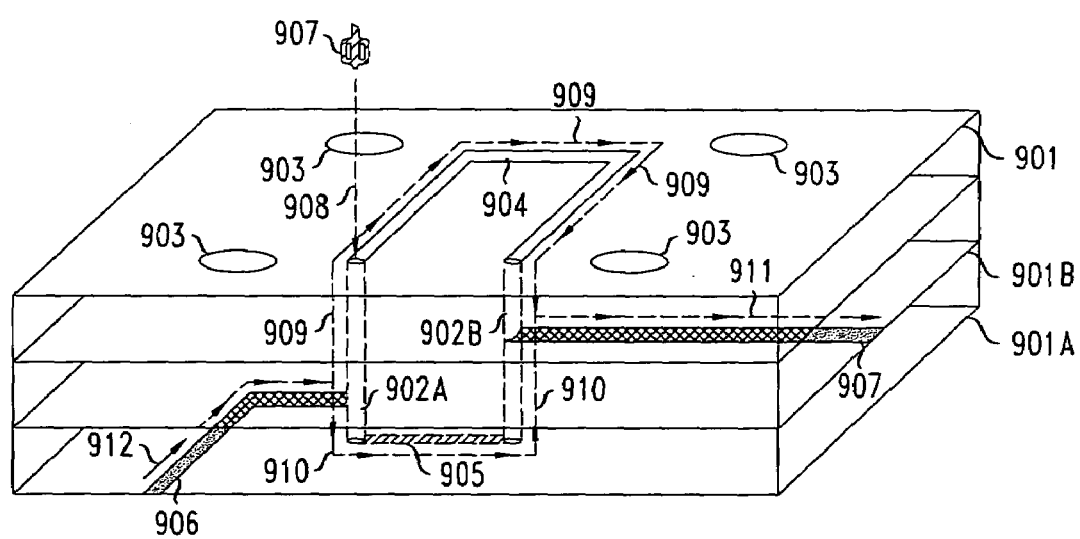
FIG. 9 shows another illustrative embodiment in accordance with the principles of the present invention whereby two delay lines are used to connect two vias in the same channel in a manner such that the resonance shown in FIG. 4A is substantially eliminated.

FIG. 9 shows another illustrative embodiment in accordance with the principles of the present invention whereby dual vias are once again used to eliminate a large portion the signal interference produced by high-frequency use of a single via configuration. However, the embodiment of FIG. 9 takes up much less circuit board space than the embodiment of FIG. 7 because signal vias 902A and 902B are placed in the same channel with no intervening ground via. Thus, the delay traces 904 and 905 do not have to be routed around a ground via and, accordingly, less circuit board space is used.

In FIG. 9, a signal is introduced onto trace 906 on layer 901A of a circuit board 901 and is conducted in direction 912 on trace 906 toward via 902A. Alternatively, instead of introducing a signal via trace 906, an illustrative connector can be used, such as press-fit connecter 907, to introduce a signal from, for example, an external electronics package. Once again, if a connector is used to introduce a signal into via 902A, trace 906 typically will not be present.

Once the signal is introduced into via 902A, part of the signal follows path 909 and part of the signal follows path 910. The signal following path 909 is conducted upward along via 902A to delay trace 904 which, in turn conducts the signal to the top of via 902B. The signal is then conducted down via 902B to trace 907. The other portion of the signal entering via 902A is conducted along path 910 down to delay trace 905 and then across to the bottom of via 902B. The signal is then conducted up to signal trace 907 on circuit board layer 901B where it is combined with the signal from path 909 and is routed to a desired destination. Once again, if the electrical length of path 909 is identical to that of path 910, the signals traveling along those paths will combine with no destructive interference.

Figure 10:
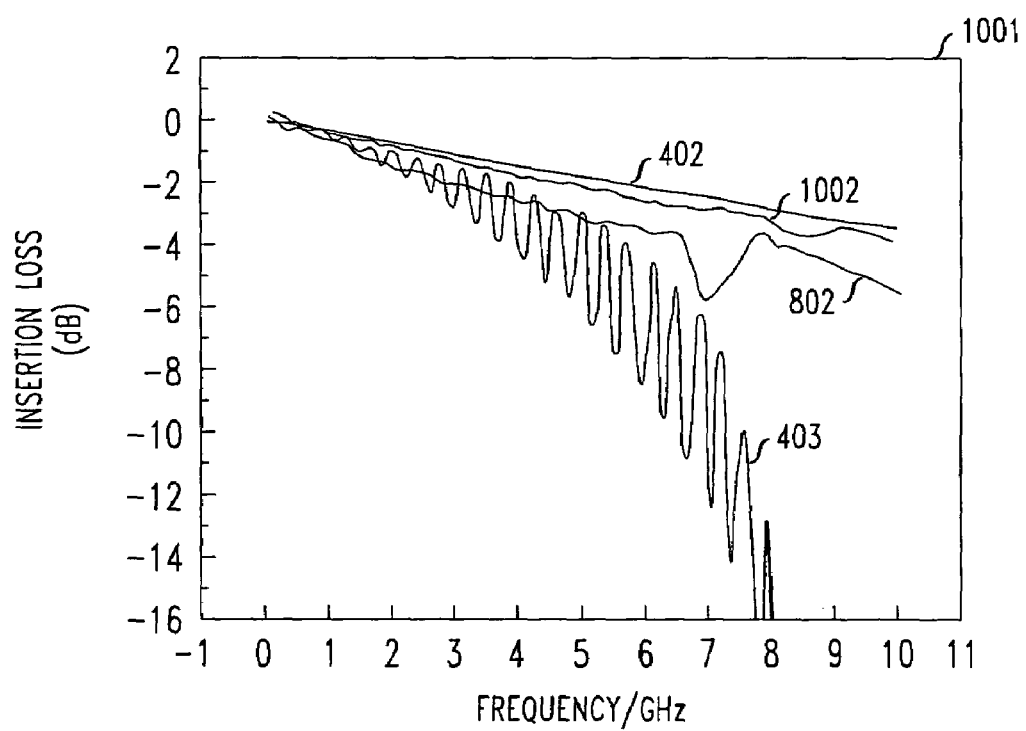
FIG. 10 shows a plot of the signal loss for the illustrative embodiment of FIG. 9.

FIG. 10 shows a graph of the signal amplitude as a function of frequency that results when the dual via configuration of FIG. 9 is used. The model used to obtain plot 1002 in that figure is identical to that used to obtain plot 403 in FIG. 4B with the exception that each of vias 407 and 411 in FIG. 4B have been replaced with a dual via configuration similar to that shown in FIG. 9, with the vias disposed in a single channel. Referring to FIG. 10 it is evident that the signal loss represented by plot 1002, using a model with the dual vias of FIG. 9, is greatly reduced relative to the single via approach, represented by plot 403. Additionally, plot 1002 also shows increased signal amplitude over plot 802, which represents the signal amplitude of a signal where the signal vias are separated by a ground via.

One skilled in the art will realize that the embodiment of FIG. 9 represents a model where the signal vias 902A and 902B in that figure are coupled together in a single channel and, thus, experience cross-talk between the two vias. While this cross-talk may produce large resonance between 15 GHz and 20 GHz, depending upon the via and trace configuration, such a single channel arrangement performs well at or above high-frequency levels of approximately 10 Ghz, while requiring a minimum of space on the circuit board.

Figure 11:
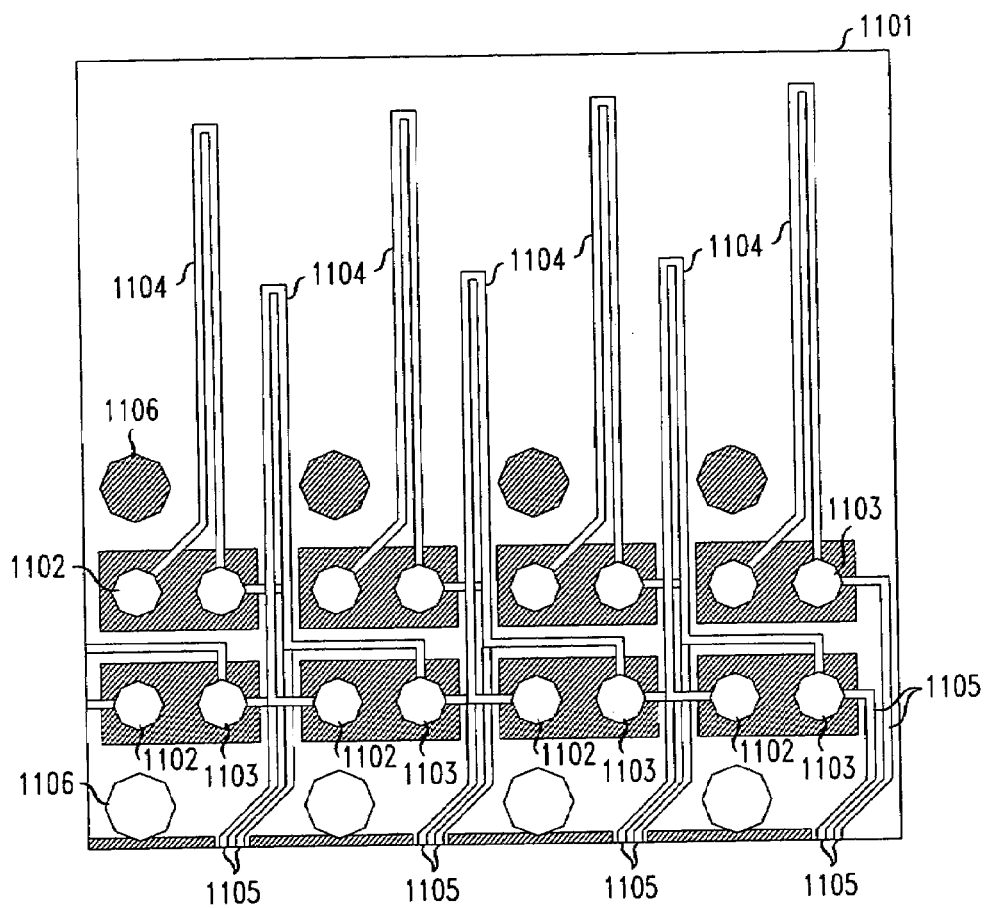
FIG. 11 shows a multipin connector in accordance with the principles of the present invention.

The embodiments above have shown how a signal can be either introduced into a via by a signal trace or by a connector, such as a press fit connector. FIG. 11 shows a top view of a portion of a circuit board that represents how the embodiments of the present invention may be used with a typical multipin connector 1101 to attach an external electronics package to a circuit board. In particular, each of vias 1102 (which are vias similar to via 902A in FIG. 9) is electrically connected with two delay lines to a second via 1103, as described in the discussion of FIG. 9. The top delay line 1104 corresponds to delay line 904 in FIG. 9. All of the connectors are disposed within a single channel between ground vias 1106. When a connection is desired each of the pins on a typical multipin connector (e.g., having press fit connection pins), is inserted into vias 1102. In the illustrative embodiment shown in FIG. 11, eight such pins would be inserted into each of vias 1102. The signal from the external package is routed, for example, down via 1102 and the top delay lines 1104 (and the bottom delay line, which is not shown) and is then routed along traces 1105 to a desired destination, as described above.

The particular configuration of the delay lines and vias when used in the signal-dense environment of a multipin connection, or in other signal-dense environments, must be carefully designed. In particular, the channel size containing the structure of signal vias and ground vias and delay lines shown in FIG. 11 must fit within the typical surface area of a multi-pin connector (e.g., 2 mm×2 mm or 2.5 mm×1.5 mm). As such, the diameter of the vias and the width and length of the delay lines small enough to maintain the required intrinsic impedance of the via. However, the extremely small vias required to achieve such a required impedance are very often difficult to drill through a typical thick multilayer circuit board. The practical limit of the ratio of via width to board thickness is typically between 1:10 and 1:20 depending on the quality of the board. Therefore, at a typical board thickness of 5.08 mm, the via diameter must stay above 500 microns at a 1:10 ratio. However, this leads to an impedance of about 60 Ohms, which is much lower than the desired 100 Ohm impedance. Therefore, the delay line impedance must be matched accordingly to prevent resonance, in this case to approximately 170 Ohms. However, this is very difficult to achieve with a typical trace line because the trace would be smaller than 100 microns, which is the limit in current printed circuit board lithography.

The illustrative configuration of upper delay lines shown in FIG. 11 overcomes this obstacle. Specifically, the hairpin configuration of the delay lines in FIG. 11 is a strongly coupled pair transmission line with a nominal impedance of 120 Ohms. This coupled pair provides two modes, an even mode and an odd mode. In this case, only the even mode, which is subjected to a higher impedance than the nominal impedance (here, approximately 150 Ohms) is excited by the incident signal-carrying electromagnetic wave. One skilled in the art will recognize that this configuration will lead to the majority of the signal being transmitted down the first via (via 1102 in FIG. 11) through the bottom of the via and up the second via (1103 in FIG. 11) to the exit trace (1105 in FIG. 11). A relatively small amount of signal will pass through the top delay line (1104 in FIG. 11). However, both of the signals over the top delay line and the bottom delay line will still be combined in a nondestructive fashion, as discussed above. This configuration allows for larger via diameters which lowers manufacturing costs and provides excellent signal integrity in high signal-density environments.

Figure 12:
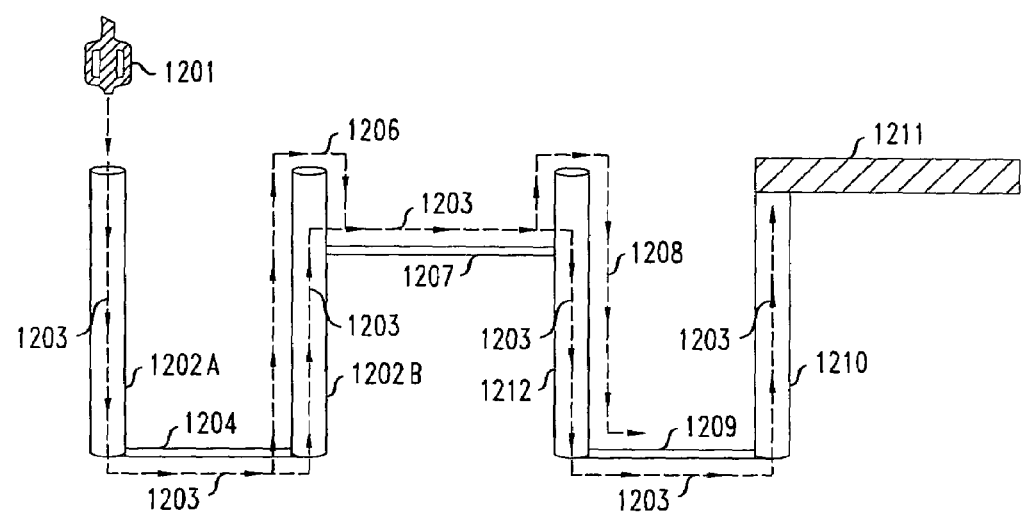
FIG. 12 shows an embodiment in accordance with the present invention, whereby a single delay trace line is used.

FIG. 12 shows an embodiment in accordance with the present invention whereby, instead of using two delay trace lines connecting two vias, such as in FIGS. 7, 9 and 11, a single delay trace line is used. In FIG. 12, a signal is illustratively introduced into via 1202A via connector 1201 which is, for example, a press-fit connector. The signal is conducted down via 1202A along path 1203 to delay trace 1204. Delay trace 1204 conducts the signal along path 1203 to via 1202B. As discussed previously, a channel is that portion of a circuit board that is electrically isolated from other parts of a circuit board by grounds, such as ground vias 703 in FIG. 7.

When the signal reaches via 1202B, part of the signal is conducted up via 1202B along path 1206 and part is conducted along continuing path 1203. When the signal traveling along path 1203 reaches trace 1207, the signal is conducted along path 1203 to a desired destination. To reduce resonance to a minimum, this desired destination will also use two vias, such as vias 1212 and 1211. This will prevent any resonance that could result, as described above, from a single via at the desired destination. Specifically, the signal travels along path 1203 on trace 1207, which is connected to via 1212. When the signal reaches via 1212, part of the signal is conducted up via 1212 along path 1208 and part is conducted along path 1203 down via 1212. The signal then travels across delay trace 1209 along path 1203 to via 1210 at which point the signal continues along path 1203 up via 1210 to an illustrative electronics package 1211.

As will be apparent in light of the foregoing discussion, a relatively low amount of undesirable resonance occurs due to the signal conducted along paths 1206 and 1208. As discussed previously, the use of two delay trace lines, between vias 1202A and 1202B and vias 1212 and 1210 respectively, such as that used in the embodiments of FIGS. 7, 9 and 11 would prevent this resonance from occurring in via 1202B and via 1212. However, one skilled in the art will recognize, in light of the description herein, that a single trace delay line, such as delay traces 1204 and 1209 in FIG. 12, will significantly reduce resonance as compared to prior art attempts. Therefore, for certain applications, the performance of the illustrative embodiment in FIG. 12 may be adequate such that a second delay trace line between each pair of vias, with the increased cost associated with such a second line, is not required.

The foregoing merely illustrates the principles of the invention. It will thus be appreciated that those skilled in the art will be able to devise various arrangements which, although not explicitly described or shown herein, embody the principles of the invention and are within its spirit and scope. Furthermore, all examples and conditional language recited herein are intended expressly to be only for pedagogical purposes to aid the reader in understanding the principles of the invention and are to be construed as being without limitation to such specifically recited examples and conditions. Moreover, all statements herein reciting aspects and embodiments of the invention, as well as specific examples thereof, are intended to encompass functional equivalents thereof.

What is claimed is:

1. A multi-layer circuit board comprising:
   a first via having a signal input location for receiving an input signal, said first via being formed and disposed completely through said multi-layer circuit board;
   a second via having a signal output location, said second via being formed and disposed completely through said multi-layer circuit board;
   a first electrical connection between said first via and said second via, forming a first electrical path between said signal input location and said signal output location; and a second electrical connection between said first via and said second via, forming a second electrical path between said signal input location and said signal output location;

wherein a first end of said first via is connected to a first end of said second via, and a second end of said first via is connected to a second end of said second via, such that said input signal travels partly in a first direction in said first via and partly in a second direction through said first via, said first direction being opposite that of said second direction;

wherein the electrical length of said first electrical path equals the electrical length of said second electrical path, and said first electrical path and said second electrical path have a same starting point and ending point, and wherein any signal degradation, as a function of amplitude loss, between said signal input location and said signal output location attributable to said first via and said second via is substantially eliminated.

2. The multi-layer circuit board of claim 1 wherein said signal input location comprises a location where an electrical transmission line connects with said first via in order to input an electromagnetic wave into said via.

3. The multi-layer circuit board of claim 1 wherein said signal output location comprises a location where an electrical transmission line connects with said second via in order to output an electromagnetic wave from said via.

4. The multi-layer circuit board of claim 1 wherein said first via and said second via are disposed in the same channel on said circuit board.

5. A multi-layer circuit board having a first via with at least a first signal input location and a second via having at least a first signal output location, said first via and said second via being drilled completely through said multi-layer circuit board, said circuit board comprising:

a plurality of electrical paths between said first signal input location and said first signal output location;

wherein a first end of said first via is connected to a first end of said second via thereby forming a first electrical path, and a second end of said first via is connected to a second end of said second via thereby forming a second electrical path, such that an input signal received at said first signal input location travels partly in a first direction in said first via and partly in a second direction through said first via, said first direction being opposite that of said second direction;

wherein the electrical length of each of said plurality of electrical paths are equal, and said first electrical path and said second electrical path have a same starting point and ending point, and wherein any signal degradation, as a function of amplitude loss, between said first input location and said first output location attributable to said first via and said second via is substantially eliminated.

6. The multi-layer circuit board of claim 5 wherein said signal input location comprises a location where an electrical transmission line connects with said first via in order to input an electromagnetic wave into said via.

7. The multi-layer circuit board of claim 5 wherein said signal output location comprises a location where an electrical transmission line connects with said second via in order to output an electromagnetic wave from said via.

8. The multi-layer circuit board of claim 5 wherein said first via and said second via are disposed in the same channel on said circuit board.

9. A method for reducing resonance in a multi-layer circuit board, said method comprising:

disposing a first via having a signal input location on said circuit board, said first via being disposed completely through said multi-layer circuit board;

disposing a second via having a signal output location on said circuit board, said second via being disposed completely through said multi-layer circuit board;

electrically connecting said first via and said second via by connecting a first end of said first via to a first end of said second via, forming a first electrical path between said signal input location and said signal output location; and electrically connecting said first via and said second via by connecting a second end of said first via to a second end of said second via, forming a second electrical path between said signal input location and said signal output location, such that an input signal received at said signal input location travels partly in a first direction in said first via and partly in a second direction through said first via, said first direction being opposite that of said second direction;

wherein the electrical length of said first electrical path equals the electrical length of said second electrical path, and said first electrical path and said second electrical path have a same starting point and ending point, and wherein any signal degradation, as a function of amplitude loss, between said signal input location and said signal output location attributable to said first via and said second via is substantially eliminated.

\* \* \* \* \*